(12) United States Patent
Fukushima

(10) Patent No.: US 6,487,700 B1
(45) Date of Patent: Nov. 26, 2002

(54) SEMICONDUCTOR DEVICE SIMULATING APPARATUS AND SEMICONDUCTOR TEST PROGRAM DEBUGGING APPARATUS USING IT

(75) Inventor: Kiyoshi Fukushima, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/520,428

(22) Filed: Mar. 8, 2000

(30) Foreign Application Priority Data

Mar. 15, 1999 (JP) .......................................... 11-067618

(51) Int. Cl.$^7$ ............................................. G06F 17/50
(52) U.S. Cl. .................................. 716/4; 716/5; 716/6
(58) Field of Search .............................. 714/22–23, 25, 714/718, 724, 734–736, 740, 743, 726, 732, 735, 738, 741; 327/198; 716/4–6

(56) References Cited

U.S. PATENT DOCUMENTS 4,764,925 A * 8/1988 Grimes et al. .............. 714/743
4,904,883 A * 2/1990 Iino et al. .................... 327/198

OTHER PUBLICATIONS

IBM Technical Disclosure Bulletin, vol. 36, No. 8, Aug. 1993, pp. 451–456.

* cited by examiner

Primary Examiner—Matthew Smith
Assistant Examiner—Naum Levin
(74) Attorney, Agent, or Firm—Dellett & Walters

(57) ABSTRACT

Herein disclosed is a semiconductor device simulation apparatus which is set the various parameters to be used for measuring a current value and a voltage value that varies depending on the internal resistance of a DUT, and simulates a current value or a voltage value that varies depending on an internal resistance of a DUT in accordance with various parameters and a prescribed test signal when receiving the test signal. Also disclosed is a semiconductor test program debugging apparatus using such a semiconductor device simulating apparatus.

9 Claims, 8 Drawing Sheets

| | LOGICAL VALUE | MEASUREMENT VALUE |
|---|---|---|
| CURRENT SOURCE VOLTAGE MEASUREMENT | H | $DVoH + (DRoH \times Is)$ |
| | L | $DVoL + (DRoL \times Is)$ |
| | Z | $DRin \times Is$ |
| VOLTAGE SOURCE CURRENT MEASUREMENT | H | $(DVoH - Vs)/DRoH$ |
| | L | $(DVoL - Vs)/DRoL$ |
| | Z | $Vs/DRin$ |

| | MEASUREMENT VALUE |
|---|---|
| VOLTAGE SOURCE CURRENT MEASUREMENT | $Vs/Vsr$ |
| CURRENT SOURCE VOLTAGE MEASUREMENT | $Vs$ |

FIG. 9

| LOGICAL VALUE OF DEVICE MODEL | VOLTAGE VALUE OBSERVED BY COMPARISON SECTION |
|---|---|
| HIGH LEVEL | DVoH |
| LOW LEVEL | DVoL |
| HIGH IMPEDANCE | APPROXIMATELY ZERO |
| INDEFINITE STATE | INDEFINITE STATE |

FIG. 10

| LOGICAL VALUE OF DEVICE MODEL | VOLTAGE VALUE OBSERVED BY COMPARISON SECTION |
|---|---|
| HIGH LEVEL | $\frac{(DVoH - Vt) \times 50}{50 + DRoH} + Vt$ |
| LOW LEVEL | $\frac{(DVoL - Vt) \times 50}{50 + DRoL} + Vt$ |
| HIGH IMPEDANCE | $Vt$ |
| INDEFINITE STATE | INDEFINITE STATE |

FIG. 11

| LOGICAL VALUE OF DEVICE MODEL | VOLTAGE VALUE OBSERVED BY COMPARISON SECTION |
|---|---|
| HIGH LEVEL | $Vt < DVoH$ : <br> $DVoH + DRoH \times ILH$ <br><br> $Vt > DVoH$ : <br> $DVoH + DRoH \times ILL$ |
| LOW LEVEL | $Vt < DVoL$ : <br> $DVoL + DRoL \times ILL$ <br><br> $Vt > DVoL$ : <br> $DVoL + DRoL \times ILH$ |
| HIGH IMPEDANCE | $DRin \times ILL >= Vt >= 0$ : <br> $Vt$ <br><br> $DRin \times ILL < Vt >= 0$ : <br> $DRin \times ILL$ <br><br> $DRin \times ILH <= Vt < 0$ : <br> $Vt$ <br><br> $DRin \times ILH > Vt < 0$ : <br> $DRin \times ILH$ |

SEMICONDUCTOR DEVICE SIMULATING APPARATUS AND SEMICONDUCTOR TEST PROGRAM DEBUGGING APPARATUS USING IT

BACKGROUND OF THE INVENTION

The present invention relates to a semiconductor device simulating apparatus that is used in a program debugging apparatus for checking a test program by emulating a semiconductor test apparatus, as well as to a semiconductor test program debugging apparatus using such a semiconductor device simulating apparatus.

Semiconductor test apparatuses are known that perform a DC test, a function test, etc. on various semiconductor devices such as logic ICs and semiconductor memories before shipment. The tests that are performed by semiconductor test apparatuses are generally classified into the function test and the DC test. In a function test, a prescribed test pattern signal is applied to a semiconductor device to be tested (hereinafter referred to as "DUT") and it is checked whether the DUT performs an expected operation for the test pattern signal. In a DC test, it is checked whether DC characteristics obtained at each terminal of a DUT are expected ones. Among the DC tests for example, there are voltage-application current-measurement tests which test whether an expected current can be output from a terminal when a known voltage is applied, and current source voltage measurement tests which test whether an expected voltage appears at a terminal when a known current is input or output. In case of function tests, in many cases, voltage conditions, current conditions, etc. that are applied to a DUT are changed in various manners such as changing a high-level-state voltage to 4 V that is lower than a regular voltage value of 5 V, for example, and changing a low-level-state voltage to 0.5 V that is higher than a regular voltage value of 0 V, for example.

In conducting a function test or a DC test, various conditions, that is, tests of what items are to be performed under what conditions are incorporated in advance in a semiconductor test program. Therefore, various tests can be performed on a DUT by running such a semiconductor test program. However, a semiconductor test program includes an enormous number of steps because it is required to control a wide variety of operations such as setting of test items, setting of test conditions, execution of a test, and judgment of a test result. When the kind of a DUT or its logic is changed, it is necessary to alter a semiconductor test program accordingly in various manners. When a semiconductor test program is newly generated or altered, it is necessary to evaluate it, that is, to check whether the program itself operates normally. One method is such that a semiconductor test program is evaluated by running it for a DUT that is known to be good or defective by using an actual semiconductor test apparatus. However, semiconductor test apparatuses themselves are expensive and are introduced in a small number. Therefore, testing whether a semiconductor test program operates normally by using an actual semiconductor test apparatus requires that operation of a semiconductor test line be stopped and hence is not preferable. In view of the above, conventionally, instead of evaluating a semiconductor test program by using an actual semiconductor test apparatus, whether the semiconductor test program operates normally is checked by emulating the semiconductor test apparatus by using a general-purpose computer such as a workstation.

For example, Japanese Patent Laid-Open No. 9-185519 discloses a technique in which a semiconductor test apparatus is emulated. This publication relates to a debugging apparatus for testing whether a semiconductor test program operates normally. This debugging apparatus configures an emulated semiconductor test apparatus by running a semiconductor test program to be debugged under the operating system of a general-purpose computer. A simulatory function test or DC test is conducted by connecting an virtual subject device section, test condition setting section, test item setting section, test result storage section, etc. to the emulated semiconductor test apparatus via an interface section and reading virtual data that are set in the virtual subject device section in accordance with test conditions that are set in the test condition setting section.

In the above debugging apparatus, instead of using an actual DUT, virtual data that are set in advance in the virtual subject device section are read into the emulated semiconductor test apparatus via the interface section in accordance with test conditions that are set in the test condition setting section. Judgments "pass" and "fail" are made when the virtual data are within or out of a range corresponding to the test conditions. As such, unlike the case of a DC test using an actual semiconductor test apparatus, the conventional virtual subject device section does not reflect operation of an actual DUT such as a value variation that depends on the internal resistance of a DUT that may occur when a voltage-application current-measurement test or a current-application voltage-measurement test is performed on a measurement subject pin (evaluation subject pin) of the actual DUT. That is, the conventional debugging apparatus merely reads virtual data that are set in advance in the virtual subject device section irrespective of the internal resistance of a DUT, and hence does not properly simulate the operation of the actual DUT.

There is another problem that when it is intended to debug a semiconductor test program by using such a virtual subject device section, part of it cannot be debugged sufficiently for the following reason. To judge the logical value of a signal, it is necessary to set high-level and low-level threshold values at proper values in consideration of a voltage variation due to the internal resistance of a DUT. However, the conventional debugging apparatus cannot judge whether threshold values that are set in a semiconductor device test program are appropriate because a voltage variation due to the internal resistance of a DUT is not taken into consideration.

SUMMARY OF THE INVENTION

The present invention has been made to in view of the above respects, and an object of the invention is therefore to provide a semiconductor device simulating apparatus capable of properly simulating and outputting a voltage value or a current value that varies depending on an internal resistance as in an actual DUT.

Another object of the invention is to provide a semiconductor test program semiconductor test program debugging apparatus capable of properly checking the contents of a semiconductor test program even in a case of using a virtual semiconductor device (hereinafter described as "device model") in the same manner as in a case where the semiconductor test program is run for an actual DUT.

According to an aspect of the invention, a semiconductor device simulating apparatus comprises parameter setting unit for setting various parameters to be used for measuring a current value or a voltage value that varies depending on an internal resistance of a DUT; input unit for inputting a test signal for the DUT; and simulating unit for simulating and outputting a current value or a voltage value that varies depending on the internal resistance of the DUT in accordance with the parameters and the test signal.

In general, a current value or a voltage value that is measured from a signal pin of a DUT varies depending on an internal resistance of the DUT. Therefore, by simulating a current value or a voltage value of a DUT with the simulating unit after setting, with the parameter setting unit, various parameters that are necessary for such a measurement, a current value or a voltage value that varies depending on an internal resistance can properly be simulated and output in the same manner as in the case of measuring an actual DUT.

In particular, it is desirable that the various parameters that are set by the parameter setting unit include a first parameter indicating a voltage value and a resistance value in a case where a signal pin of a DUT is in a high-level state, a second parameter indicating a voltage value and a resistance value in a case where the signal pin is in a low-level state, a third parameter indicating a resistance value in a case where the signal pin is in a high-impedance state, a fourth parameter indicating which of the high-level state, low-level state, and the high-impedance state the signal pin is in, and a fifth parameter indicating a current value or a voltage value to be applied to the signal pin in a current source voltage measurement or a voltage source current measurement. Further, it is desirable that the above described simulating unit simulates a voltage value that would appear at each signal pin of the DUT in the current source voltage measurement or a current value that would appear at each signal pin of the DUT in the voltage source current measurement based on these first to fifth parameters and the test signal.

When a voltage source current measurement or a current source voltage measurement is performed by applying a prescribed voltage or current in a case where a signal pin is in a high-level state, the fourth parameter indicates that a high-level state is established. Therefore, the simulating unit outputs a current value or a voltage value corresponding to the signal pin based on the voltage value and the resistance value that are indicated by the first parameter and the application voltage value or current value that is indicated by the fifth parameter. When applying a prescribed voltage or current in a case where the signal pin is in a low-level state performs a voltage source current measurement or a current source voltage measurement, the fourth parameter indicates that a low-level state is established. Therefore, the simulating unit outputs a current value or a voltage value corresponding to the signal pin based on the voltage value and the resistance value that are indicated by the second parameter and the application voltage value or current value that is indicated by the fifth parameter. When applying a prescribed voltage or current in a case where the signal pin is in a high-impedance state performs a voltage source current measurement or a current source voltage measurement, the fourth parameter indicates that a high-impedance state is established. Therefore, the simulating unit outputs a current value or a voltage value corresponding to the signal pin based on the resistance value that are indicated by the third parameter and the application voltage value or current value that is indicated by the fifth parameter. Since in this manner the various parameters are set so as to conform to a current source voltage measurement or a voltage source current measurement, a voltage value or a current value that varies depending on an internal resistance can properly be simulated and output in the same manner as in the case of measuring an actual DUT.

In particular, it is desirable that the various parameters that are set by the above described parameter setting unit include a sixth parameter indicating a resistance value corresponding to a power source pin of a DUT and a seventh parameter indicating a current value or a voltage value to be applied to the power source pin. In this case, it is desirable that the above described simulating unit simulates a voltage value that would appear at the power source pin in a current source voltage measurement or a current value that would appear at the power source pin in a voltage source current measurement based on the sixth and seventh parameters and the test signal.

When a voltage source current measurement or a current source voltage measurement is performed by applying a prescribed voltage or current to a power source pin, a current value or a voltage value corresponding to the power source pin is properly simulated and output from the simulating unit based on the resistance value indicated by the sixth parameter and the application voltage value or current value indicated by the seventh parameter.

In particular, it is desirable that the various parameters that are set by the above described parameter setting unit include a first parameter indicating a voltage value and a resistance value in a case where a signal pin of a DUT is in a high-level state, a second parameter indicating a voltage value and a resistance value in a case where the signal pin is in a low-level state, a third parameter indicating a resistance value in a case where the signal pin is in a high-impedance state, and a fourth parameter indicating which of the high-level state, low-level state, and the high-impedance state the signal pin is in. In this case, it is desirable that the test signal that is input by the input unit indicates a condition relating to a load that is to be connected to the signal pin.

In a case where a signal pin of a DUT is in a high-level state and the load condition is no load, the fourth parameter indicated that a high-level state is established. Therefore, the simulating unit outputs a voltage value corresponding to the signal pin based on the voltage value and the resistance value indicated by the first parameter and a test signal indicating a no-load condition. In a case where the signal pin is in a low-level state and the load condition is no load, the fourth parameter indicated that a low-level state is established. Therefore, the simulating unit outputs a voltage value corresponding to the signal pin based on the voltage value and the resistance value indicated by the second parameter and the test signal indicating a no-load condition. In a case where the signal pin is in a high-impedance state and the load condition is no load, the fourth parameter indicated that a high-impedance state is established. Therefore, the simulating unit outputs a voltage value corresponding to the signal pin based on the resistance value indicated by the third parameter and the test signal indicating a no-load condition. Similarly, in other cases such as a case where the load condition is an ideal voltage source and a terminating resistor or a programmable load with an ideal current source, the simulating unit outputs a voltage value based on such a load condition. By taking the load condition into consideration in this manner, a voltage value or a current value that varies depending on an internal resistance can properly be simulated and output in the same manner as in the case of measuring an actual DUT.

According to another aspect of the invention, a semiconductor test program debugging apparatus comprises tester emulating unit for setting various parameters to be used for measuring a current value or a voltage value that varies depending on an internal resistance of a DUT, and for emulating an operation of a semiconductor test apparatus by generating a simulatory test signal to be applied to the DUT based on a semiconductor test program; device simulating unit receiving the parameters and the test signal, for simulating and outputting a current value or a voltage value that varies depending on an internal resistance of the DUT in accordance with the parameters and the test signal; and debugging unit for debugging the semiconductor test program based on an output of the device simulating unit.

The device simulating unit corresponds to the above-described semiconductor device simulating apparatus. That is, the semiconductor test program debugging apparatus according to the invention is formed by using the above-described semiconductor device simulating apparatus. Therefore, the device simulating unit properly simulates an operation of a DUT by taking into consideration a voltage variation due to an internal resistance of the DUT. This makes it possible to conduct tests that cannot be performed conventionally such as a test as to whether high-level and low-level threshold values that are described in a semiconductor test program are appropriate. As a result, the accuracy of debugging of a semiconductor test program can be increased.

BRIEF DESCRIPTION OF THE DRAWINGS

FIG. 9 shows logical output values of the device model that are observed by a comparison section in a case where a load condition setting section is not connected to the device model (no-load case);

FIG. 10 shows logical output values of the device model that are observed by the comparison section in a case where an ideal voltage source (ideal voltage source of a tester driver) and a terminating resistor of the load condition setting section are connected to the device model; and FIG. 11 shows logical output values of the device model that are observed by the comparison section in a case where the load condition setting section that operates as a programmable load is connected to the device model.

DESCRIPTION OF THE PREFERRED EMBODIMENT

Figure 1:
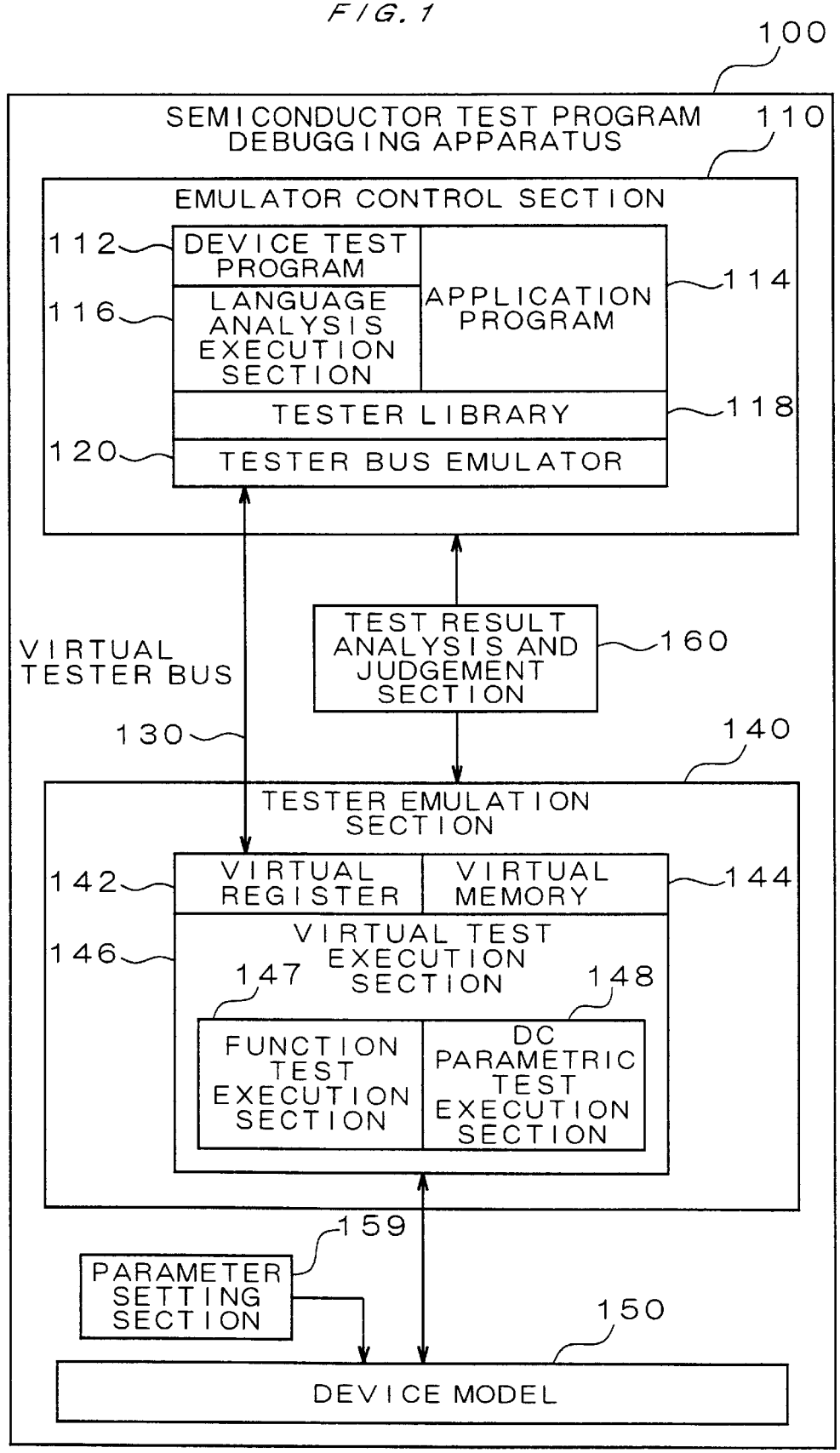
FIG. 1 shows the entire configuration of a semiconductor test program debugging apparatus according to an embodiment of the present invention.

A semiconductor test program debugging apparatus according to an embodiment to which a semiconductor device simulating apparatus of the present invention is applied will be hereinafter described with reference to the accompanying drawings. FIG. 1 shows the entire configuration of the semiconductor test program debugging apparatus. The semiconductor test program debugging apparatus 100, which is implemented by a general-purpose computer such as a workstation, serves to check whether a semiconductor test program operates normally by emulating an operation of a semiconductor test apparatus and simulating an operation of a DUT.

The semiconductor test program debugging apparatus 100 according to the embodiment emulates or simulates operations of an actual semiconductor test apparatus and DUT. Therefore, before describing the debugging apparatus in detail, the configuration of a semiconductor test apparatus to be emulated will be described.

Figure 2:
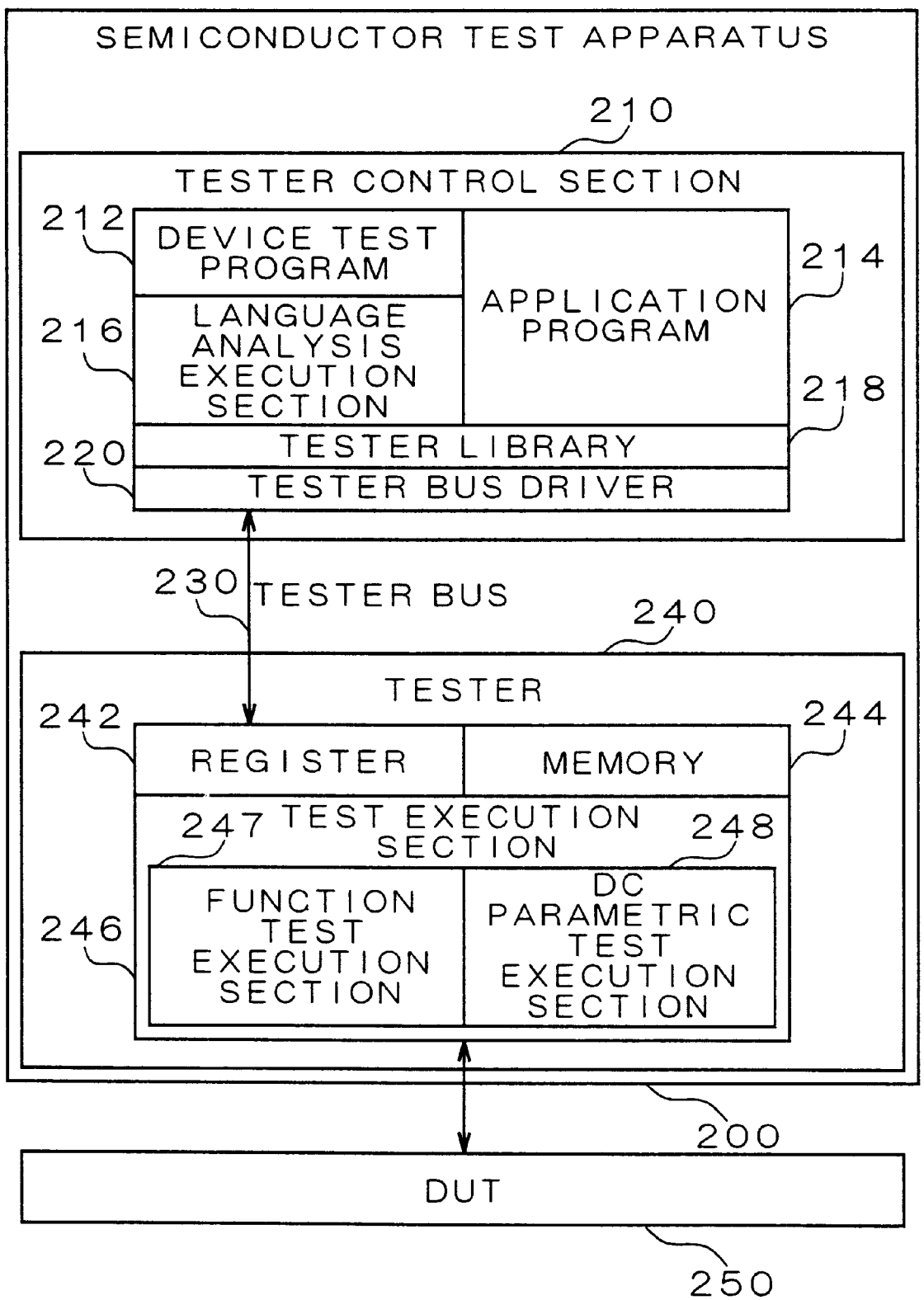
FIG. 2 shows the entire configuration of a semiconductor test apparatus.

FIG. 2 shows the entire configuration of an actual semiconductor test apparatus. FIG. 2 shows a state that an actual DUT 250 is connected to a semiconductor test apparatus 200. The semiconductor test apparatus 200 performs various DC tests (DC parametric tests) and function tests on the DUT 250. The semiconductor test apparatus 200 includes a tester control section 210, a tester bus 230, a tester 240, and a socket section (not shown) to be mounted with the DUT 250.

The tester control section 210, which controls operation of the tester 240, includes a semiconductor test program (device test program) 212, an application program 214, a language analysis execution section 216, a tester library 218, and a tester bus driver 220.

The device test program 212 describes a procedure and a method of a test that a user intends to perform on the DUT 250 by using the semiconductor test apparatus 200. In general, this type of device test program is developed and generated by the user of the semiconductor test apparatus 200. Therefore, the user can generate a device test program that is very close to completion by checking whether the user-generated device test program 212 operates normally by using the semiconductor test program debugging apparatus 100 according to the embodiment rather than the actual semiconductor test apparatus 200. The language analysis execution section 216, which performs parsing etc. on the device test program 212, plays a central role in causing the semiconductor test apparatus 200 to operate faithfully according to the device test program 212. The application program 214, which operates in cooperation with the device test program 212 and the language analysis execution section 216, applies an actual test signal etc. corresponding to a function test or a DC test to the DUT 250, capturing an output signal of the DUT 250, and judging whether the subject semiconductor 250 is good or defective and analyzes its characteristics.

The tester library 218 converts the instructions of the device test program 212 that have been obtained by parsing by the language analysis execution section 216 into register-level instructions (i.e., data relating to an instruction to write data to registers 242 and an instruction to read data from the registers 242 (described later)), whereby the test library 218 generates and sets data that are necessary for operation of the semiconductor test apparatus 200 and instructs the tester 240 on a measurement operation. The tester bus driver 220 transfers the data generated by the tester library 218 to the registers 242 of the tester 240 via the tester bus 230.

The tester 240 performs various tests on the DUT 250 based on the data that are captured from the tester control section 210 via the tester bus 230. The tester 240 includes the registers 242, a memory 244, and a test execution section 246. The registers 242 store the data that are captured from the tester library 218 via the tester bus 230. The data stored in the registers 242 are output to the test execution section 246 directly or via the memory 244. The registers 242 and the memory 244 have a test result storage area (not shown) where to store data relating to a test result that are supplied from the test execution section 246.

The test execution section 246 has a function test execution section 247 and a DC parametric test execution section 248. The test execution section 246 performs a function test or a DC parametric test on the DUT 250 based on the data that have been supplied from the tester library 218 and are stored in the registers 242 or the memory 244, and stores test result data in the test result storage area of the registers 242 or the memory 244. The test result data stored in the registers 242 and the memory 244 are caused by the tester bus driver 220 to be directly captured by the tester library 218 via the tester bus 230. The tester library 218 via the register 242 captures the test result data stored in the memory 244.

The semiconductor test program debugging apparatus 100 of FIG. 1 emulates the entire operation of the above-described semiconductor test apparatus 200 and simulates an operation of the DUT 250. Therefore, by running, by using the semiconductor test program debugging apparatus 100 of FIG. 1, the device test program 112 that was generated for the semiconductor test apparatus 200, it can be checked whether the operation of the device test program 112 coincides with the operation intended by the user. Next, the configuration of the semiconductor test program debugging apparatus 100 according to the embodiment will be described.

An emulator control section 110 shown in FIG. 1 includes a device test program 112, an application program 114, a language analysis execution section 116, a tester library 118, and a tester bus emulator 120. The emulator control section 110, which controls operation of a tester emulation section 140, performs basically the same operation as the tester control section 210 of the semiconductor test apparatus 200 shown in FIG. 2.

The device test program 112, which is a program to be debugged by the semiconductor test program debugging apparatus 100, describes a procedure and a method of a test to be performed on the DUT 250 by using the semiconductor test apparatus 200. Therefore, the device test program 212 shown in FIG. 2 is ported, as it is, to serve as the device test program 112 and operate in the same manner. Similarly, for the application program 114, the language analysis execution section 116, and the tester library 118, the application program 214, the language analysis execution section 216, and the test library 218 shown in FIG. 2 are ported as they are and operate in the same manners. The tester bus emulator 120 drives a virtual tester bus 130 that imaginarily connects the emulator control section 110 to the tester emulation section 140, and controls data exchange between the tester library 118 and the tester emulation section 140 via the virtual tester bus 130.

The tester emulation section 140, which is a software-implemented version of the tester 240 shown in FIG. 2, performs a simulatory test on a device model 150 according to operation commands that are supplied from the tester library 118 of the emulator control section 110. The tester emulation section 140 includes virtual registers 142, a virtual memory 144, and a virtual test execution section 146. The virtual registers 142 store data that are supplied from the tester library 118. The data stored in the virtual registers 142 are sent to the virtual test execution section 146 directly or via the virtual memory 144. The virtual registers 142 and the virtual memory 144 have a test result storage area (not shown) where to store the data of virtual test result that are output from the virtual test execution section 146.

The virtual test execution section 146 has a function test execution section 147 and a DC parametric test execution section 148. The virtual test execution section 146 causes the function test execution section 147 to perform a function test or causes the DC parametric test execution section 148 to perform a DC parametric test on the device model 150 by outputting a prescribed signal to the device model 150 based on the data that have been supplied from tester library 118 and are stored in the virtual registers 142, and stores the data of virtual test result in the test result storage area of the virtual registers 142 or the virtual memory 144. The test result data stored in the virtual registers 142 and the virtual memory 144 are output to the tester library 118 via the virtual tester bus 130. A test result analysis and judgment section 160 examines and compares each other the data of virtual test result stored in the virtual registers 142, the virtual memory 144, or the tester library 118 and a test result expectation value that is expected in advance, judges whether the device test program 112 operates normally, and displays a judgment result to the user. For example, if an erroneous test result is obtained as a result of execution of the device test program 112, the test result analysis and judgment section 160 displays a line number or the like of the program 112 that caused the erroneous test result on a monitor (not shown) or print it with a printer (not shown).

The above-described virtual test execution section 146 corresponds to an input unit, the device model 150 corresponds to a simulating unit and a device simulating unit, and a parameter setting section 159 corresponds to a parameter setting unit. The emulator control section 110, the tester emulation section 140, and the parameter setting section 159 correspond to a tester emulating unit. The test result analysis and judgment section 160 corresponds to a debugging unit.

Next, the operation of the tester emulation section 140 will be described. When access to the virtual registers 142 is made via the virtual tester bus 130, the tester emulation section 140 calculates, by using the addresses of the virtual registers 142, which location of the virtual register 142 the access is directed to, and writes data to or read data from that location. Further, when access to the virtual memory 144 occurs indirectly through access to the virtual registers 142, the tester emulation section 140 writes data to or read data from the virtual memory 144. In this case, in general, with a single virtual register 142, it is impossible to obtain sufficient information to write data to or read data from the virtual memory 144. In view of this, in this embodiment, the tester emulation section 140 writes data to or reads data from the virtual memory 144 by referring to the contents of related virtual registers 142. When processing is to be performed in the same manner as in the semiconductor test apparatus 200 shown in FIG. 2, the data of virtual test result that are stored in the virtual memory 144 are output to the tester library 118 via the virtual registers 142 and the virtual tester bus 130. The semiconductor test program debugging apparatus 100 may be configured in such a manner that the data of virtual test result stored in the virtual memory 144 are directly output to the tester library 118.

When access is made to a particular register that is provided to command starting of waveform generation (function test) of the tester emulation section 140, the virtual test execution section 146 performs waveform generation as a first task. At this time, since data necessary for waveform generation are stored in advance in the virtual registers 142 and the virtual memory 144, the virtual test execution section 146 generates a waveform by referring to those data. The waveform generated by the virtual test execution section 146 is transferred to the device model 150. The device model 150 simulates an operation of the actual DUT 250 based on the received waveform. Output pin data that is obtained as a result of the simulation performed by the device model 150 is fed back to the virtual test execution section 146, where the output data is compared with an expectation value and a comparison result is stored in a prescribed virtual register 142 and the virtual memory 144. The above series of operations is performed in synchronism with operation cycles of the tester emulation section 140.

The parameter setting section 159 sets, in the device model 150, various parameters such as a voltage value of an ideal voltage source and a current value of an ideal current source to be applied to a DUT 250, a high-level-state or low-level-state pure resistance value and voltage value, and a pure resistance value corresponding to a power source pin. The characteristics of the DUT are determined according to the setting contents of the parameter setting section 159.

The device model 150 simulates an operation that would be performed by the actual DUT 250 shown in FIG. 2. Specifically, when the parameter setting section 159 has set parameters for a current source voltage measurement or a voltage source current measurement (such as a voltage value of an ideal voltage source a current value of an ideal current source to be applied to a DUT, a high-level-state or low-level-state pure resistance value, and a pure resistance value corresponding to a power source pin), the device model 150 simulates, based on those parameters, a current value or a voltage values that would be output from the actual DUT 250, and outputs it. The tester emulation section 140 does not simulate logic parts of the tester one by one; instead, paying attention to the characteristics of the tester, the tester emulation section 140 generates one-cycle waveform data (mainly timing data and a waveform format) according to an event scheme, and supplies the generated waveform data to the device model 150. The device model 150 operates until one tester cycle completes while simulating its logic parts one by one according to an event-driven scheme. At a time point when one tester cycle has completed, the device model 150 stops the simulation while holding its internal states, and transfers output variations during the cycle to the tester emulation section 140 according to an event scheme. The tester emulation section 140 analyzes again the one-cycle output variations that are supplied from the device model 150, compares those with expectation values, and stores a pass/fail judgment result in the virtual registers 142 or the virtual memory 144. The above operation increases the efficiency of the waveform generation by the tester emulation section 140. Further, since data are processed on a cycle-by-cycle basis, the data transfer efficiency is increased. If necessary, data of a plurality of cycles may be processed collectively.

Figures 3, 4:
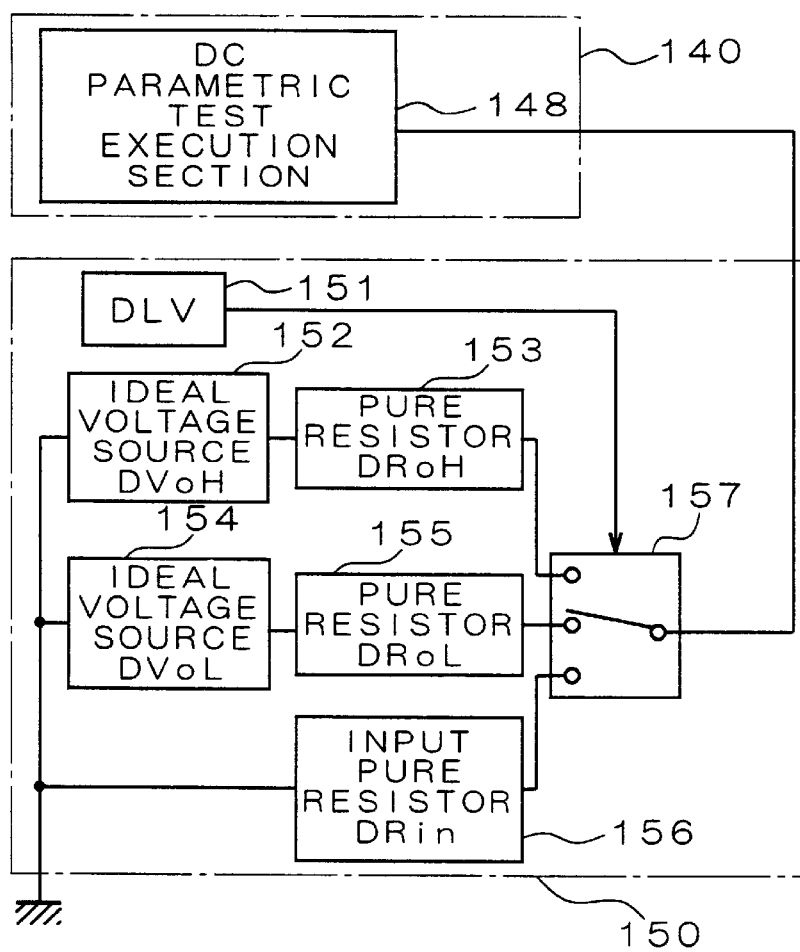
FIG. 3 is an equivalent circuit diagram of a device model that should be realized in a case where a signal pin measurement is performed in a DC parametric test.
FIG. 4 shows measurement values that are obtained in a case where a signal pin measurement is performed in a DC parametric test.

The details of the device model 150 will be hereinafter described. FIG. 3 is an equivalent circuit diagram showing the details of a device model 150 that should be realized in a case where the virtual test execution section 146 performs a signal pin measurement of a DC parametric test. In this case, the device model 150 includes a DLV (Device Logical Value) holding section 151, a high-level-state ideal voltage source 152, a low-level-state ideal voltage source 154, a high-level-state pure resistor 153, a low-level-state pure resistor 155, a high-impedance-state input pure resistor 156, and a switching section 157. The ideal voltage source 152 and the pure resistor 153 are connected to each other in series, and the ideal voltage source 154 and the pure resistor 155 are also connected to each other in series.

The DLV holding section 151 holds a logical value corresponding to a level state of a pin under measurement (i.e., a signal pin to be measured) of the DUT 250. The DLV holding section 151 holds a logical value corresponding to a high level (H), a low level (L), a high impedance (Z), an indefinite state (X). The ideal voltage source 152 stores a voltage value DVoH that would appear at a pin under measurement of the DUT 250 when the logical value of a signal that is output from the pin under measurement is at a high level. The pure resistor 153 stores a resistance value DRoH that would occur with a pin under measurement of the DUT 250 when the logical value of a signal that is output from the pin under measurement is at a high level. The ideal voltage source 154 stores a voltage value DVoL that would appear at a pin under measurement of the DUT 250 when the logical value of a signal that is output from the pin under measurement is at a low level. The pure resistor 155 stores a resistance value DRoL that would occur with a pin under measurement of the DUT 250 when the logical value of a signal that is output from the pin under measurement is at a low level. The input pure resistor 156 stores a resistance value DRin that would occur with a pin under measurement of the DUT 250 when the pin under measurement is in a high-impedance state.

The switching section 157 selectively connects the series connection of the ideal voltage source 152 and the pure resistor 153, the series connection of the ideal voltage source 154 and the pure resistor 155, or the input pure resistor 156 to the DC parametric test execution section 148 in accordance with the logical value that is held by the DLV holding section 151. Specifically, when the logical value held by the DLV holding section 151 corresponds to a high level, the switching section 157 connects the series connection of the ideal voltage source 152 and the pure resistor 153 to the DC parametric test execution section 148. When the logical value held by the DLV holding section 151 corresponds to a low level, the switching section 157 connects the series connection of the ideal voltage source 154 and the pure resistor 155 to the DC parametric test execution section 148. When the logical value held by the DLV holding section 151 corresponds to a high impedance, the switching section 157 connects the input pure resistor 156 to the DC parametric test execution section 148. When the logical value held by the DLV holding section 151 corresponds to an indefinite state, the switching section 157 selects one of the two series connections and the input pure resistor 156 or outputs a message without selecting any of those.

FIG. 4 shows a specific example of measurement values that are output from the device model 150 when a signal pin measurement of a DC parametric test is performed on the device model 150. FIG. 4 shows two cases of current-application voltage-measurement and voltage-application current-measurement. In case of current-application voltage-measurement, the DC parametric test execution section 148 supplies the device model 150 with a current value Is (a simulated version of the value of a current that flows through a pin under measurement of the DUT 250). Therefore, when the logical value held by the DLV holding section 151 corresponds to a high level (H), since the ideal voltage source 152 and the pure resistor 153 are connected to the DC parametric test execution section 148, a measurement value (voltage value) of the DC parametric test execution section 148 amounts to the sum of the voltage value DVoH of the ideal voltage source 152 and a terminal voltage value across the pure resistor 153 (i.e., the product of the resistance value DRoH and the current value Is: DRoH×Is). When the logical value corresponds to a low level (L), since the ideal voltage source 154 and the pure resistor 155 are connected to the DC parametric test execution section 148, a measurement value (voltage value) by the DC parametric test execution section 148 amounts to the sum of the voltage value DVoL of the ideal voltage source 154 and a terminal voltage value across the pure resistor 155 (i.e., the product of the resistance value DRoL and the current value Is: DRoL×Is). When the logical value corresponds to a high impedance (Z), since the input pure resistor 156 is connected to the DC parametric test execution section 148, a measurement value (voltage value) of the DC parametric test execution section 148 amounts to a terminal voltage value across the pure resistor 156 (i.e., the product of the resistance value DRin and the current value Is: DRin×Is).

In case of voltage-application current-measurement, the DC parametric test execution section 148 applies, to the device model 150, a voltage value Vs (a simulated version of the value of a voltage that is applied to a pin under measurement of the DUT 250). Therefore, when the logical value held by the DLV holding section 151 corresponds to a high level (H), since the ideal voltage source 152 and the pure resistor 153 are connected to the DC parametric test execution section 148, a measurement value (current value) of the DC parametric test execution section 148 amounts to a value (DVoH−Vs) /DRoH that is obtained by dividing, by the resistance value DRoH of the pure resistor 153, a value obtained by subtracting the application voltage value Vs from the voltage value DVoH of the ideal voltage source 152. When the logical value corresponds to a low level (L), since the ideal voltage source 154 and the pure resistor 155 are connected to the DC parametric test execution section 148, a measurement value (current value) of the DC parametric test execution section 148 amounts to a value (DVoL−Vs) /DRoL that is obtained by dividing, by the resistance value DRoL of the pure resistor 155, a value obtained by subtracting the application voltage value Vs from the voltage value DVoL of the ideal voltage source 154. When the logical value corresponds to a high impedance (Z), since the input pure resistor 156 is connected to the DC parametric test execution section 148, a measurement value (current value) of the DC parametric test execution section 148 amounts to a value Vs/DRin that is obtained by dividing the application voltage Vs by the resistance value DRin of the input pure resistor 156.

As described above, with the device model 150 according to the embodiment, a measurement value corresponding to an application current value Is or an application voltage value Vs can be output by setting or changing the values of the ideal voltage sources 152 and 154, the pure resistors 153 and 155, and the input pure resistor 156, whereby a DC parametric test can be performed in a manner close to the manner of a DC parametric test performed on the actual DUT 250. Further, a section similar to a load condition setting section 171 (described later with reference to FIG. 8) may be provided in the DC parametric test execution section 148.

Figures 5, 6:
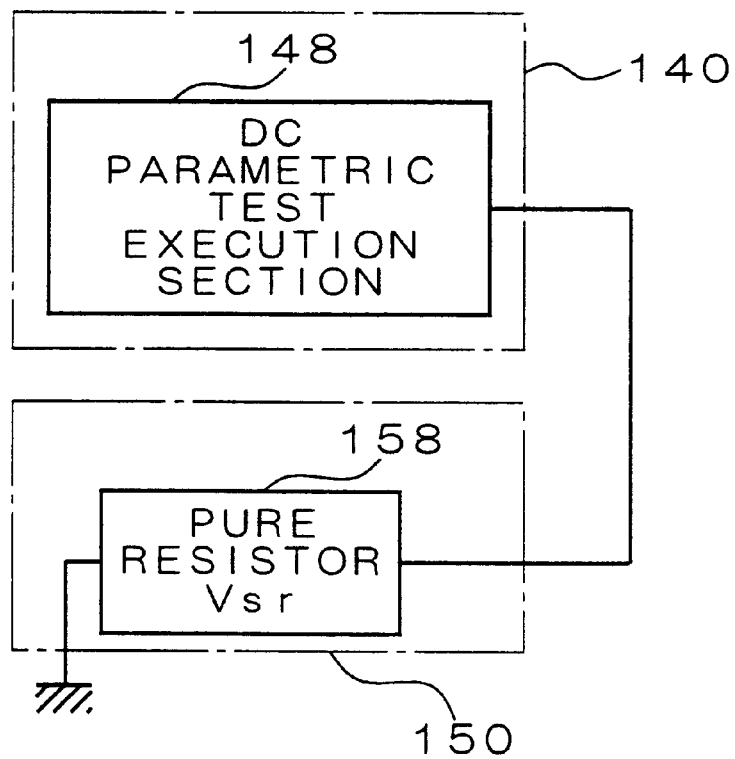
FIG. 5 is an equivalent circuit diagram of a device model that should be realized in a case where a power source pin measurement is performed in a DC parametric test.
FIG. 6 shows measurement values that are obtained in a case where a power source pin measurement is performed in a DC parametric test.

FIG. 5 is an equivalent circuit diagram showing the details of a device model 150 that should be realized in a case where the virtual test execution section 146 performs a power source pin measurement of a DC parametric test. In this case, the device model 150 is formed by a pure resistor 158. The pure resistor 158 has a resistance value Vsr of a resistor corresponding to a pin under measurement (power source pin) of the DUT 250. Therefore, when a power source pin measurement is performed, the pure resistor 158 having the resistance value Vsr is connected to the DC parametric test execution section 148. The DC parametric test execution section 148 performs a voltage source current measurement or a current source voltage measurement in a state that the pure resistor 158 is connected to the DC parametric test execution section 148.

FIG. 6 shows a specific example of measurement values that are output from the device model 150 when a power source pin measurement of a DC parametric test is performed on the device model 150 of FIG. 5. When the voltage value of a signal that is output from the DC parametric test execution section 148 to the device model 150 is Vs (a simulated version of the value of a voltage that is applied to a pin under measurement of the DUT 250), a measurement value (current value) of a voltage source current measurement amounts to a value Vs/Vsr that is obtained by dividing the application voltage value Vs by the resistance value Vsr of the pure resistor 158 and a measurement value (voltage value) of a current source voltage measurement amounts to the application voltage value Vs itself.

Figure 7:
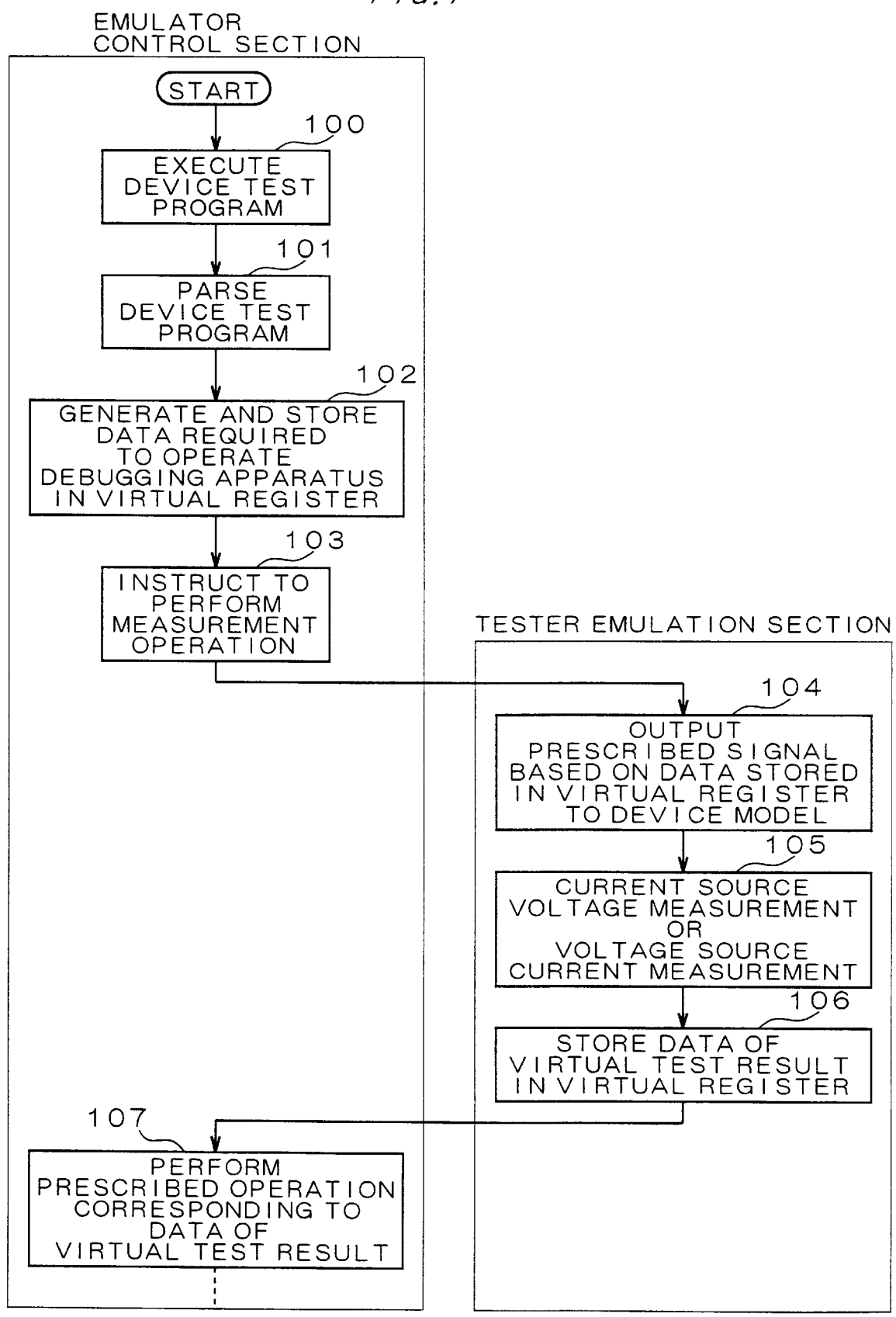
FIG. 7 is a flowchart showing a process of the semiconductor test program debugging apparatus in running a device test program for a DC parametric test.

Next, the operation of the semiconductor test program debugging apparatus 100 will be described with reference to the drawings. FIG. 7 is a flowchart showing a process that is executed by the semiconductor test program debugging apparatus 100 in running a device test program 112 for a DC parametric test. The process starts when a user orders debugging of the device test program 112. First, at step 100, execution of the device test program 112 as a subject of the debugging operation is started. At step 101, the language analysis execution section 112 of the emulator control section 110 parses the device test program 112. After completion of the parsing by the language analysis execution section 116, at step 102 the tester library 118 converts the instructions of the device test program 112 into register-level instructions, generates data that are necessary for the operation of the semiconductor test program debugging apparatus 100 based on the register-level instructions, and stores the generated data in the virtual registers 142 of the tester emulation section 140. After completion of the data storage in the virtual registers 142, at step 103 the emulator control section 110 instructs the tester emulation section 140 to perform a measurement operation.

When instructed by the emulator control section 110 to perform a measurement operation, the tester emulation section 140 performs a simulated version of a DC parametric test on the device model 150 according to operation commands that are supplied from the tester library 118 of the emulator control section 110. Specifically, at step 104, according to operation commands supplied from the tester library 118 of the emulator control section 110, the DC parametric test execution section 148 of the virtual test execution section 146 outputs, to the device model 150, a prescribed signal that is based on the data stored in the virtual registers 142. At step 105, the device model 150 performs a current source voltage measurement or a voltage source current measurement and outputs the value obtained by the measurement. At this time, since as described above the device model 150 takes into consideration a resistance value corresponding to a pin under measurement of the DUT, the measurement value reflects the above resistance value. When a measurement value is output from the device model 150, at step 106 the DC parametric test execution section 148 stores the measurement value in the virtual registers 142 or the virtual memory 144 as the data of virtual test result. The data of virtual test result stored in the virtual registers 142 or the virtual memory 144 are output to the tester library 118 of the emulator control section 110, and the tester library 118 performs a prescribed operation corresponding to the data of virtual test result.

The device test program 112 describes what operations should be performed for various measurement results, respectively. Therefore, if an operation that is performed by the tester library 118 for the data of virtual test result is one intended by a person who generated the program, it is confirmed that a corresponding portion of the device test program 112 has no error. Conversely, if an operation that is performed by the tester library 118 for the data of virtual test result is not one intended by a person who generated the program, it is confirmed that a corresponding portion of the device test program 112 has an error. The debugging of the device test program 112 is performed in this manner.

As described above, since the device model 150 takes into consideration an internal resistance of the actual DUT as shown in FIGS. 3 and 5, a simulation can be performed in such a manner that a measurement value obtained by the DC parametric test execution section 148 reflects a resistance value corresponding to a pin under measurement of the DUT 250. Therefore, having the device model 150, the semiconductor test program debugging apparatus 100 can properly emulate an operation of the semiconductor test apparatus 200 in a DC parametric test without the need for using the DUT 250 and hence can increase of the accuracy of debugging of the device test program 112. For example, in judging the logical value of a signal, it is necessary to set high-level and low-level threshold values at proper values in consideration of a voltage variation due to an internal resistance of the subject test semiconductor device 250. Since a voltage variation due to an internal resistance of the subject test semiconductor device 250 is taken into consideration in the semiconductor test program debugging apparatus 100 according to the embodiment, the semiconductor test program debugging apparatus 100 can judge whether threshold values that are set in the device test program 112 are proper.

Figure 8:
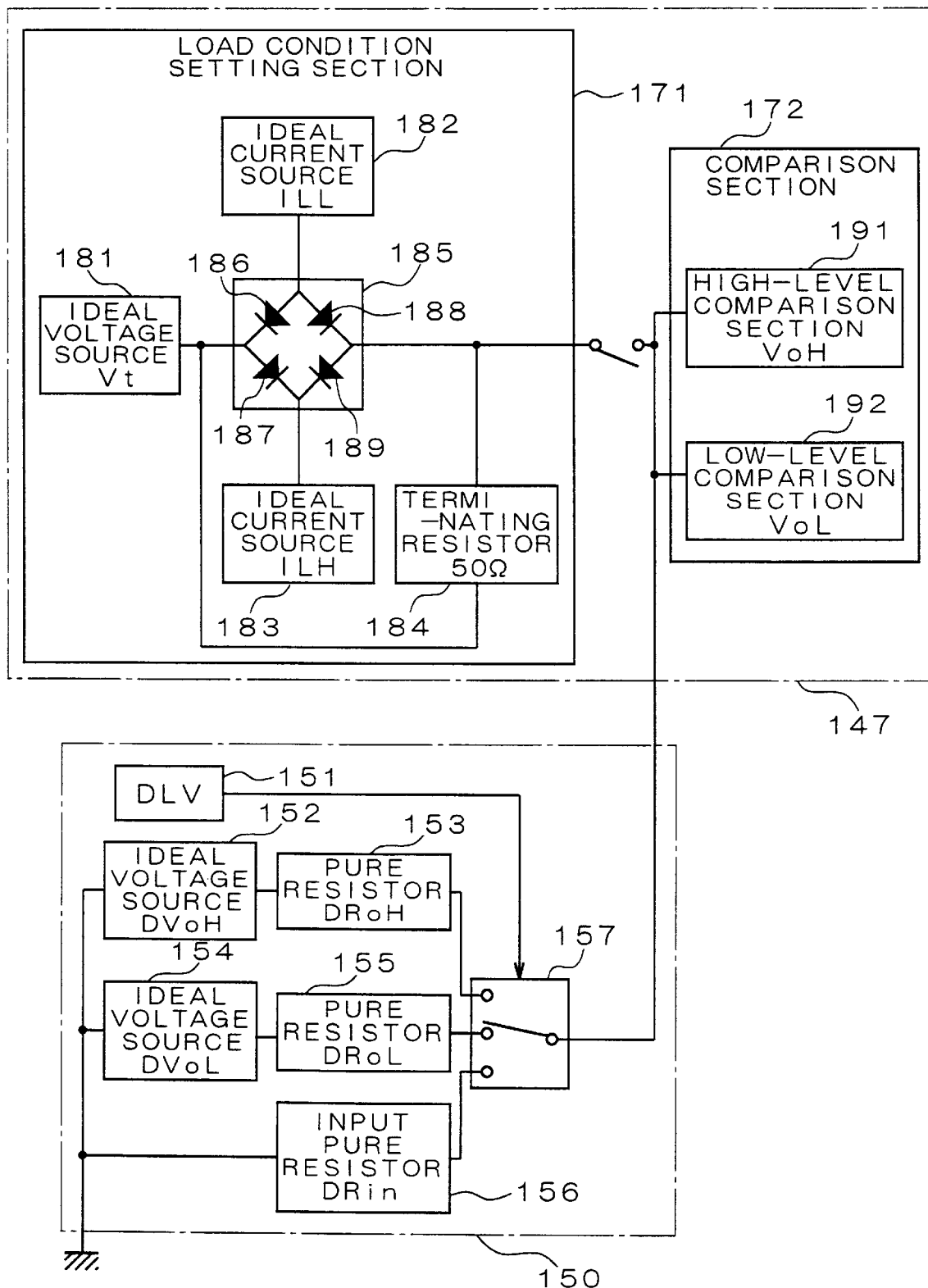
FIG. 8 is an equivalent circuit diagram of a function test execution section of a virtual test execution section and a device model that should be realized in a case where the function test execution section performs a function test.

Whereas the above description of the embodiment was directed to the case where the device model 150 simulates an operation in a DC parametric test of the semiconductor test apparatus 200, the device model 150 can simulate an operation in a function test in a similar manner. FIG. 8 is an equivalent circuit diagram showing the details of a function test execution section 147 of the virtual test execution section 146 and an device model 150 that should be realized when the function test execution section 147 performs a function test. The details of the device model 150 in this case are the same as those of the device model 150 that should be realized in performing a signal pin measurement of a DC parametric test as shown in FIG. 3, and hence will not be described.

The function test execution section 147 of the virtual test execution section 146 that is connected to the device model 150 serves to judge the logical value of a signal that is output from the device model 150, and is composed of a load condition setting section 171 and a comparison section 172. The load condition setting section 171 includes an ideal voltage source 181, a low-level-state ideal current source 182, a high-level-state ideal current source 183, a terminating resistor 184 (having a resistance value of 50 Ω, for example), and a bridge circuit 185. The load condition setting section 171, which is usually called a programmable load, automatically selects, as a load current source, the ideal current source 182 or 183 by comparing an output voltage of the DUT 250 with a threshold voltage (i.e., a voltage value of the ideal voltage source 181) Vt, and connects it to the device model 150. The ideal voltage source 181 stores a voltage value Vt of an ideal voltage source of a tester driver (not shown) in the semiconductor test apparatus 200. The ideal current source 182 stores a current value ILL supplied by an ideal current source of the tester driver in a case where the logical value of the tester driver corresponds to a low level. The ideal current source 183 stores a current value ILH supplied by an ideal current source of the tester driver in a case where the logical value of the tester driver corresponds to a high level. The bridge circuit 185 includes four diodes 186–189. The comparison section 172 includes a high-level comparison section 191 and a low-level comparison section 192. The high-level comparison section 191, which is to judge whether a signal that is output from the device model 150 is at a high level, makes a comparison to judge whether the voltage value of a signal that is output from the device model 150 is greater than or equal to a reference voltage value VoH. The low-level comparison section 192, which is to judge whether a signal that is output from the device model 150 is at a low level, makes a comparison to judge whether the voltage value of a signal that is output from the device model 150 is smaller than or equal to a reference voltage value VoL.

FIGS. 9–11 show logical output values of a signal that is output from the device model 150 and voltage values in the comparison section 172. FIG. 9 shows logical output values of the device model 150 that are observed by the comparison section 172 in a case where the load condition setting section 171 is not connected to the device model 150. When the logical output value of the device model 150 corresponds to a high level (H), since the ideal voltage source 152 and the pure resistor 153 are connected to the comparison section 172, the comparison section 172 observes the voltage value DVoH of the ideal voltage source 152. Based on the voltage value DVoH, the comparison section 172 judges through comparison whether the logical output value of the device model 150 corresponds to a high level or a low level. When the logical output value of the device model 150 corresponds to a low level (L), since the ideal voltage source 154 and the pure resistor 155 are connected to the comparison section 172, the comparison section 172 observes the voltage value DVoL of the ideal voltage source 154. Based on the voltage value DVoL the comparison section 172 judges through comparison whether the logical output value of the device model 150 corresponds to a high level or a low level. When the logical output value of the device model 150 corresponds to a high impedance (Z), since only the input pure resistor 156 is connected to the comparison section 172, a voltage value observed by the comparison section 172 amounts to approximately zero. In this case, the comparison section 172 judges that the logical output value corresponds to a low level.

FIG. 10 shows logical output values of the device model 150 that are observed by the comparison section 172 in a case where the ideal voltage source 181 (ideal voltage source of the tester driver) and the terminating resistor 184 of the load condition setting section 171 are connected to the device model 150. In this case, the ideal current sources 182 and 183 and the bridge circuit 185 are assumed to be no existence. When the logical value of the device model 150 corresponds to a high level (H), since the ideal voltage source 152 and the pure resistor 153 are connected to the ideal voltage source 181 and the terminating resistor 184, a voltage value observed by the comparison section 172 amounts to $((DVoH-Vt) \times 50)/(50+DRoH)+Vt$, which is the sum of a terminal voltage value across the terminating resistor 184 $((DVoH-Vt) \times 50)/(50+DRoH)$ and the voltage value Vt of the ideal voltage source 181. When the logical value of the device model 150 corresponds to a low level (L), since the ideal voltage source 154 and the pure resistor 155 are connected to the ideal voltage source 181 and the terminating resistor 184, a voltage value observed by the comparison section 172 amounts to ((DVoL−Vt)×50)/(50+DRoL)+Vt, which is the sum of a terminal voltage value across the terminating resistor 184 ((DVoL−Vt)×50)/(50+DRoL) and the voltage value Vt of the ideal voltage source 181. When the logical value of the device model 150 corresponds to a high impedance (Z), the input pure resistor 156 is connected to the ideal voltage source 181 and the terminating resistor 184, a voltage value observed by the comparison section 172 amounts to a terminal voltage value across the terminating resistor 184. In this case, since the resistance value DRin of the input pure resistor 156 is much greater than the resistance value of the terminating resistor 184, substantially no current flows through the terminating resistor 184 and hence a voltage value observed by the comparison section 172 amounts to the voltage value Vt of the ideal voltage source 181.

FIG. 11 shows logical output values of the device model 150 that are observed by the comparison section 172 in a case where the load condition setting section 171 that operates as a programmable load is connected to the device model 150. When the logical value of the device model 150 corresponds to a high level (H) and the voltage value Vt of the ideal voltage source 181 is smaller than the voltage value DVoH of the ideal voltage source 152 (Vt<DVoH), since the ideal voltage source 152 and the pure resistor 153 are connected to the ideal current source 183, a voltage value observed by the comparison section 172 amounts to DVoH+DRoH×ILH. When the logical value of the device model 150 corresponds to a high level (H) and the voltage value Vt of the ideal voltage source 181 is greater than the voltage value DVoH of the ideal voltage source 152 (Vt>DVoH), since the ideal voltage source 152 and the pure resistor 153 are connected to the ideal current source 182, a voltage value observed by the comparison section 172 amounts to DVoH+DRoH+ILL.

When the logical value of the device model 150 corresponds to a low level (L) and the voltage value Vt of the ideal voltage source 181 is greater than the voltage value DVoL of the ideal voltage source 154 (Vt>DVoL), since the ideal voltage source 154 and the pure resistor 155 are connected to the ideal current source 183, a voltage value observed by the comparison section 172 amounts to DVoL+DRoL×ILH. When the logical value of the device model 150 corresponds to a low level (L) and the voltage value Vt of the ideal voltage source 181 is smaller than the voltage value DVoL of the ideal voltage source 154 (Vt<DVoL), since the ideal voltage source 154 and the pure resistor 155 are connected to the ideal current source 182, a voltage value observed by the comparison section 172 amounts to DVoL+DRoL×ILL.

When the logical value of the device model 150 corresponds to a high impedance (Z), a voltage value observed by the comparison section 172 amounts the following value that depends on the voltage value Vt of the ideal voltage source 181. When the voltage value Vt of the ideal voltage source 181 is a positive value that is smaller than or equal to a terminal voltage value across the input pure resistor 156, that is, when DRin×ILL≧Vt≧0, a voltage value observed by the comparison section 172 amounts to the voltage value Vt of the ideal voltage source 181. When the voltage value Vt of the ideal voltage source 181 is a positive value that is greater than a terminal voltage value across the input pure resistor 156, that is, when DRin×ILL<Vt≧0, a voltage value observed by the comparison section 172 amounts to the terminal voltage value DRin×ILL across the input pure resistor 156. When the voltage value Vt of the ideal voltage source 181 is a negative value that is greater than or equal to a terminal voltage value across the input pure resistor 156, that is, when DRin×ILH≦Vt<0, a voltage value observed by the comparison section 172 amounts to the voltage value Vt of the ideal voltage source 181. When the voltage value Vt of the ideal voltage source 181 is a negative value that is smaller than a terminal voltage value across the input pure resistor 156, that is, when DRin×ILH>Vt<0, a voltage value observed by the comparison section 172 amounts to the terminal voltage value DRin×ILH across the input pure resistor 156. In cases of FIGS. 9–11, when the logical value of the device model 150 corresponds to an indefinite state, a logical value output also becomes indefinite.

As shown in FIGS. 9–11, the voltage value observed by the comparison section 172 reflects a resistance value that corresponds to a pin under measurement of the DUT 250. That is, an internal resistance of the DUT 150 shown in FIG. 2 is taken into consideration in the device model 150 shown in FIG. 8. Therefore, by using the device model 150 shown in FIG. 8, the semiconductor test program debugging apparatus 100 can properly simulate an operation of the semiconductor test apparatus 200 in a function test without the need for using the DUT 250. Hence, the semiconductor test program debugging apparatus 100 can increase the accuracy of debugging of the device test program 112.

The above embodiment is directed to the semiconductor test program debugging apparatus 100 for debugging a device test program for a test of the DUT 250. The DUT 250 may be any of various devices such as semiconductor memories, various processors, and logic ICs.

Although the above embodiment is directed to the case of forming a simulatory (equivalent) device model by switching among a series connection of a high-level-state ideal voltage source and pure resistor, a series connection of a low-level-state ideal voltage source and pure resistor, and an input pure resistor, the invention is not limited to such a case and a simulatory device may be formed that performs a complex operation in which the voltage value of an ideal voltage source and a resistance value vary in accordance with measurement conditions. Further, although in the above embodiment an output of a device model is obtained through calculation, it may be obtained by table conversion.

As described above, a first aspect of the invention provides an advantage that an operation of an actual DUT can be simulated properly so as to reflect a voltage variation or a current variation that is caused by an internal resistance of the semiconductor device.

According to a second aspect of the invention, since an virtual semiconductor device simulates an operation of an actual DUT in such a manner that a voltage variation or a current variation that is caused by an internal resistance of the semiconductor device is taken into consideration, that is, in the same manner as in a case where a semiconductor test program is run for the actual DUT. Therefore, the contents of a semiconductor test program can be checked.

What is claimed is:

1. A semiconductor device simulating apparatus for simulation operation as if an actual DUT were present, comprising:

parameter setting unit for setting various parameters to be used for measuring a current value or a voltage value that varies depending on an internal resistance of a DUT;

input unit for inputting a test signal for as would be applicable to said actual DUT; and simulating unit for simulating and outputting a current value or a voltage value that varies depending on an internal resistance of said actual DUT in accordance with said parameters and said test signal as if said actual DUT were present, without requiring said actual DUT to be present.

2. The semiconductor device simulating apparatus according to claim 1, wherein said parameters include a first parameter indicating a voltage value and a resistance value in a case where a signal pin representative of a signal pin of said actual DUT is in a high level state, a second parameter indicating a voltage value and a resistance value in a case where said signal pin is in a low level state, a third parameter indicating a resistance value in a case where said signal pin is in a high impedance state, a fourth parameter indicating which of the high level state, low level state, and the high impedance state said signal pin is in, and a fifth parameter indicating a current value or a voltage value to be applied to said signal pin in a current source voltage measurement or a voltage source current measurement.

3. The semiconductor device simulating apparatus according to claim 2, wherein said simulating unit simulates a voltage value that would appear at said signal pin in the current source voltage measurement based on said first to fifth parameters and said test signal.

4. The semiconductor device simulating apparatus according to claim 2, wherein said simulating unit simulates a current value that would appear at said signal pin in the voltage source current measurement based on said first to fifth parameters and said test signal.

5. The semiconductor device simulating apparatus according to claim 1, wherein said parameters set by said parameter setting unit include a sixth parameter indicating a resistance value corresponding to a power source pin of said actual DUT and a seventh parameter indicating a current value or a voltage value as would be applicable to said power source pin.

6. The semiconductor device simulating apparatus according to claim 5, wherein said simulating unit simulates a voltage value that would appear at said power source pin in a current source voltage measurement based on said sixth and seventh parameters and said test signal.

7. The semiconductor device simulating apparatus according to claim 5, wherein said simulating unit simulates a current value that would appear at said power source pin in a voltage source current measurement based on said sixth and seventh parameters and said test signal.

8. The semiconductor device simulating apparatus according to claim 1, wherein said parameters include a first parameter indicating a voltage value and a resistance value in a case where a signal pin representative of a signal pin of said actual DUT is in a high level state, a second parameter indicating a voltage value and a resistance value in a case where said signal pin is in a low level state, a third parameter indicating a resistance value in a case where said signal pin is in a high impedance state, and a fourth parameter indicating which of the high level state, low level state, and the high impedance state said signal pin is in, and wherein said test signal indicates a condition relating to a load that is to be connected to said signal pin.

9. A semiconductor test program debugging apparatus comprising:

tester emulating unit for setting various parameters to be used for measuring a current value or a voltage value that varies depending on an internal resistance of an actual DUT, and for emulating an operation of a semiconductor test apparatus by generating a simulatory test signal as would be applicable to an actual DUT based on a semiconductor test program;

device simulating unit receiving said parameters and said test signal, for simulating and outputting a current value or a voltage value that varies depending on an internal resistance of said actual DUT in accordance with said parameters and said test signal; and debugging unit for debugging said semiconductor test program based on an output of said device simulating unit.

\* \* \* \* \*